United States Patent [19]

Dressler

[11] Patent Number: 4,528,686
[45] Date of Patent: Jul. 9, 1985

[54] FADER CIRCUIT FOR VEHICLE SOUND SYSTEM

[75] Inventor: Roger W. Dressler, Pleasant Hills, Calif.

[73] Assignee: Motorola, Inc., Schaumburg, Ill.

[21] Appl. No.: 566,939

[22] Filed: Dec. 30, 1983

[51] Int. Cl.³ .............................................. H03G 3/00
[52] U.S. Cl. ...................................... 381/28; 381/105; 381/109
[58] Field of Search ........................ 381/104, 105, 109; 330/145, 284; 455/232

[56] References Cited

U.S. PATENT DOCUMENTS 4,404,527 9/1983 Schertz et al. .................. 381/109 X Primary Examiner—Forester W. Isen
Attorney, Agent, or Firm—Margaret Marsh Parker; John H. Moore; James W. Gillman

[57] ABSTRACT

A two-channel audio amplifier for use in a vehicle sound system is provided. Each channel drives a pair of loudspeakers and includes a common amplifier connected to drive one terminal of each speaker. The remaining speaker terminals are connected to the outputs of a pair of additional amplifiers. Signals of one phase are applied to the common amplifier. Signals of opposite phase are applied to the additional amplifiers. Signals in phase with the common amplifier are applied to the inputs of the additional amplifiers through field-effect transistors. Control signals applied to the control electrodes of the transistors control the magnitude of the applied in-phase signal to independently control the output level of the speakers.

12 Claims, 4 Drawing Figures

FADER CIRCUIT FOR VEHICLE SOUND SYSTEM

BACKGROUND OF THE INVENTION

The present invention relates generally to multi-speaker sound reproduction systems, and more particularly to a fader circuit for selectively attenuating audio signals produced by individual speakers in such a system.

Stereophonic sound reproduction systems, particularly those intended for use in automobiles, frequently include two or more individual loudspeakers in each audio channel. For example, it is a common practice to locate one loudspeaker in each of the four corners of an automobile passenger compartment. By selectively attenuating the sound reproduced by the front and rear pair of speakers, the apparent source of reproduced sound can be shifted, thereby permitting the system to be adjusted to suit the particular desires of the front and rear seat passengers.

To provide independent variable attenuation of the front and rear speaker signals, multi-speaker sound reproduction systems are typically provided with some form of fader control. One well-known fader control calls for the use of separate amplifiers, each of which drives a single speaker. By independently adjusting the gain of each amplifier, reproduced signals can be selectively attenuated as desired. However, the use of separate amplifiers greatly increases the cost and complexity of the resulting audio system.

Another known fader control technique calls for connecting a pair of speakers to each output of a conventional two-channel stereophonic amplifier. Variable resistors or potentiometers, connected in series with each speaker, add or subtract resistance as needed to achieve the desired attenuation. Since it is required that each resistance be able to dissipate considerable power, the components involved are of necessity bulky, limiting the degree of miniaturization obtainable when the technique is used.

To overcome the deficiencies of prior fader control arrangements, the present invention provides a purely electronic fader control. Mechanically actuate components are eliminated, resulting in improved reliability and compatibility with totally electronic push-button designs is provided. The relatively small space requirements of the fader circuitry permit the construction of miniature units having significantly less distortion than systems relying on variable resistances. Finally, the present invention provides a wider attenuation range than that available under prior systems together with greater manufacturing economy.

In view of the foregoing, it is a general object of the present invention to provide a new and improved multi-speaker sound reproduction system.

It is a more specific object of the present invention to provide a new and improved fader control for multi-speaker sound reproduction systems.

It is a still more specific object of the present invention to provide an electronic fader control for sound reproduction systems.

SUMMARY OF THE INVENTION

The invention is directed to a two-channel audio amplifier for use with multi-speaker stereophonic sound reproduction systems of the type in which each audio channel includes first and second two-terminal loudspeakers. Each channel of the audio amplifier includes a first source of low-level audio signals for providing low-level audio signals of one phase. A second source of low-level audio signals provides signals of phase opposite to the phase of the signals provided by the first source. A first amplifier has its input connected with the first signal source and has its output commonly connected to one terminal of each of the first and second loudspeakers. A second amplifier has its input connected with the second signal source and has its output connected with the remaining terminal of the first loudspeaker. A third amplifier has its input connected with the second signal source and has its output connected with the remaining terminal of the second loudspeaker. A first variable impedance is connected between the first signal source and the input of the second amplifier and couples signals from the first source to the input of the second amplifier. The impedance of the first variable impedance is continuously variable in response to application of a first control signal. The degree of coupling between the first signal source and the input of the second amplifier is thereby controlled by the first control signal. A second variable impedance is connected between the first signal source and the input of the third amplifier and couples signals from the first source to the input of the third amplifier. The impedance of the second variable impedance is continuously variable in response to application of a second control signal. The degree of coupling between the first signal source and the input of the third amplifier is thereby controlled by the second control signal. Accordingly, application of the first and second control signals regulates the magnitude of signals coupled from the first source and applied to the inputs of the second and third amplifiers. This, in turn, results in variation of the audio outputs produced by the first and second loudspeakers connected to the amplifier audio channel.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
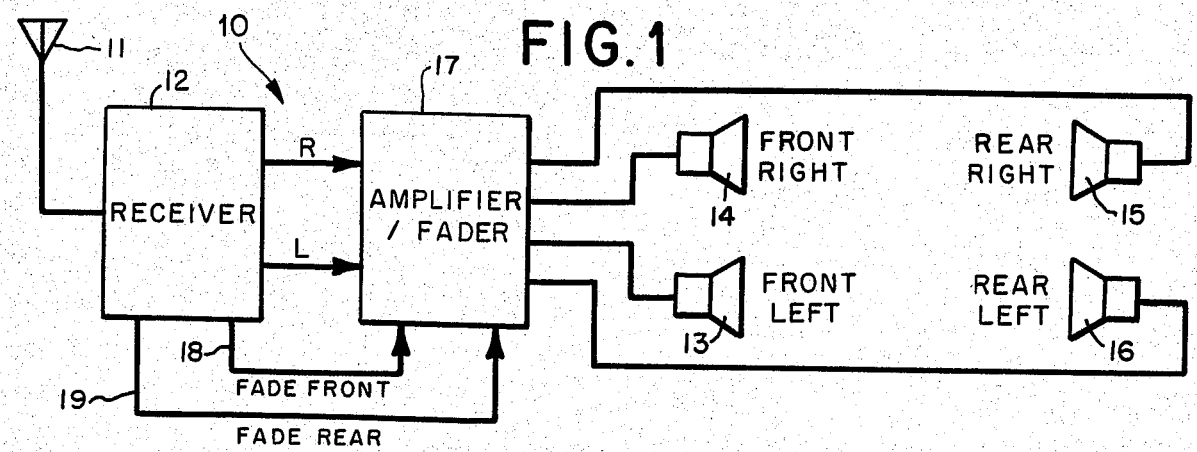
FIG. 1 is a simplified functional block diagram of a multi-speaker automobile sound system incorporating an electronic fader control constructed in accordance with the present invention.

Referring to the drawings, and particularly to FIG. 1, a stereophonic multi-speaker automobile sound system 10 is illustrated. Standard frequency modulated (FM) signals transmitted by FM broadcast stations are intercepted by an antenna 11 and applied to a receiver 12 which in known manner demodulates the signal to recover right (R) and left (L) channel audio information carried on the respective audio channels. Typically, the receiver 12 may also include standard magnetic tape audio cassette playback equipment for playback of audio cassettes. As shown, the system includes four loudspeakers 13-16 of known construction located respectively at the front-left, front-right, rear-right and rear-left corners of the automobile passenger compartment. In accordance with conventional practice, audio information carried on the right audio channel is reproduced by the front-right and rear-right speakers 14 and 15, while left channel audio information is reproduced by front-left and rear-left speakers 13 and 16 respectively. To drive the loudspeakers, the audio system includes a two-channel stereophonic audio power amplifier 17. To permit continuous and independent attenuation of sound reproduced by the front and rear pairs of speakers, the amplifier 17, in accordance with the present invention, is provided with fader control circuitry responsive to first and second fade control signals generated within the receiver and applied to the amplifier through fade front and fade rear control lines 18 and 19. To attenuate either the front or rear pair of speakers, an appropriate control on the receiver unit is actuated resulting in application of the appropriate control signal to the amplifier.

Figure 2:
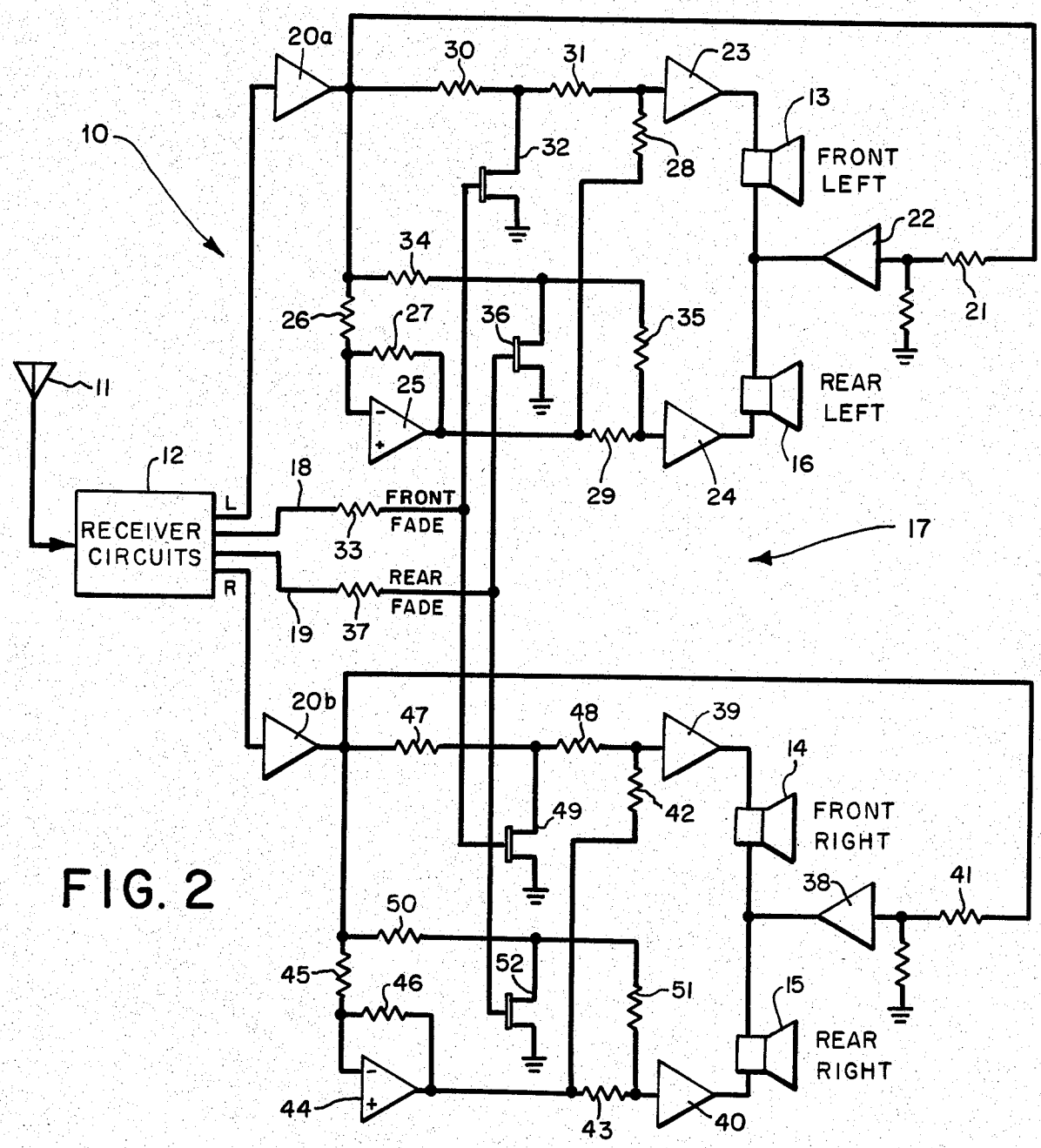
FIG. 2 is a simplified schematic diagram of the two-channel stereophonic audio amplifier illustrated in FIG. 1.

As illustrated in FIG. 2, within the amplifier 17, the right and left audio channels may be identical to one another. Accordingly, the description which follows will be directed to operation of the left audio channel, it being understood that the right audio channel operates in identical manner. Left channel audio information provided at the output of the receiver circuits 12 is applied to the input of a buffer amplifier 20a which serves primarily to isolate the receiver circuits from the remaining circuitry of the power amplifier and serves as a source of low-level audio signals. The output of buffer 20a is applied through a resistor 21 to the input of a first amplifier 22, the output of which is connected commonly to one input each of the front-left and rear-left speakers 13 and 16 respectively. The left channel of the audio power amplifier further includes a second amplifier 23 and a third amplifier 24 the outputs of which are connected individually to the remaining terminals of the front-left and rear-left speakers 13 and 16 respectively. During operation of the amplifier, the low level audio signal appearing at the output of the buffer is applied to the inputs of the second and third amplifiers, resulting in their generating output signals exactly 180° out of phase with the output provided by the first amplifier. Each speaker produces a sound output in response to the out of phase signals which drive it resulting in reproduction of the desired audio signal.

To provide a source of input signals for the second and third amplifiers, the amplifier includes a second source of low level audio signals. This source includes an inverter circuit comprising a differential amplifier 25, the inverting input of which is connected through resistor 26 to the output of the buffer amplifier 20a. A feedback resistor 27 connected between the output of amplifier and its inverting input, thereby setting the gain of the inverter stage.

The output of the inverter is applied through resistors 28 and 29 to the inputs of the second and third amplifiers 23 and 24 respectively. It will be noted that the signals thus produced at the output of the inverter and applied to the inputs of the second and third amplifiers will be of opposite sense to the signal applied to the input of the first amplifier 22 through resistor 21.

To permit independent attenuation of sound produced by the front-left speaker 13, the amplifier, in accordance with the invention includes fader control circuitry. In this respect, the input of the second amplifier 23 is connected through series connected resistors 30 and 31 to the output of the buffer amplifier 20a. The juncture of resistors 30 and 31 is connected to the drain of a first field-effect transistor (FET) 32, the source of which is connected to ground thereby forming a "T" attenuator between the output of buffer amplifier 20a and the input of second amplifier 23. FET 32 acts as a variable impedance audio gating element, the impedance of which is controlled by the front fade control voltage generated within the receiver circuits 12 and applied to its gate through a resistor 33.

With the addition of the fader control circuitry, the signal applied to the input of the second amplifier 23 will be the sum obtained by adding the inverted signal produced by amplifier 25 and applied through resistor 28 to the non-inverted signal appearing at the output of buffer amplifier 20a and applied through resistors 30 and 31. The magnitude of the inverted signal thus applied is a function of the inverter circuit network gain and the value of resistor 28, while the level of the non-inverted signal may be adjusted by varying the front-fade control voltage level applied to the gate of FET 32 thereby causing more or less of the non-inverted signal to be applied therethrough. By adjusting the front-fade control voltage, the signal applied to the input of the second amplifier may be continuously variable from a full level inverted input corresponding to minimum FET impedance to an essentially full level non-inverted input corresponding to maximum impedance provided by FET 32. Accordingly, the output of the second amplifier 23 will vary from a full-level output which is 180° out of phase with the output of the first amplifier to a full-level, in-phase output. As a result, the output of speaker 13 will vary from maximum to minimum.

To permit adjustment of the audio level provided by the rear-left speaker 16, a similar electronic fader circuit comprising resistors 34,35 and FET 36 is provided in the input circuit of the third amplifier 24. A rear fade control signal generated by the receiver circuit and applied to the gate of FET 36 through a resistor 37 operates independently of the front-fade control signal thereby permitting independent attenuation of the front-left and rear-left speakers.

As previously developed, the right channel of the amplifier operates in the same manner as the left audio channel. Accordingly, amplifier 20b corresponds to buffer amplifier 20a, amplifiers 38, 39 and 40 correspond to the first, second and third amplifiers of the left audio channel while resistors 41, 42 and 43 correspond to resistors 21, 28 and 29 respectively. The corresponding inverter circuit comprises differential amplifier 44 together with resistors 45 and 46. The front and rear electronic fader control circuit comprises resistors 47, 48, FET 49 and resistors 50, 51 and FET 52 respectively. It will be observed that the front fade control signal which controls audio output levels of the front-left and front-right speakers are commonly applied to the gates of FETs 32 and 49. Accordingly, a front-fade control signal generated in the receiver circuit will cause both the front-right and front-left speaker outputs to be attenuated, thereby resulting in attenuation of both front speaker outputs. Similarly, a rear fade control signal will cause the outputs of both the rear-right and rear-left speakers to be simultaneously attenuated.

Figure 3:
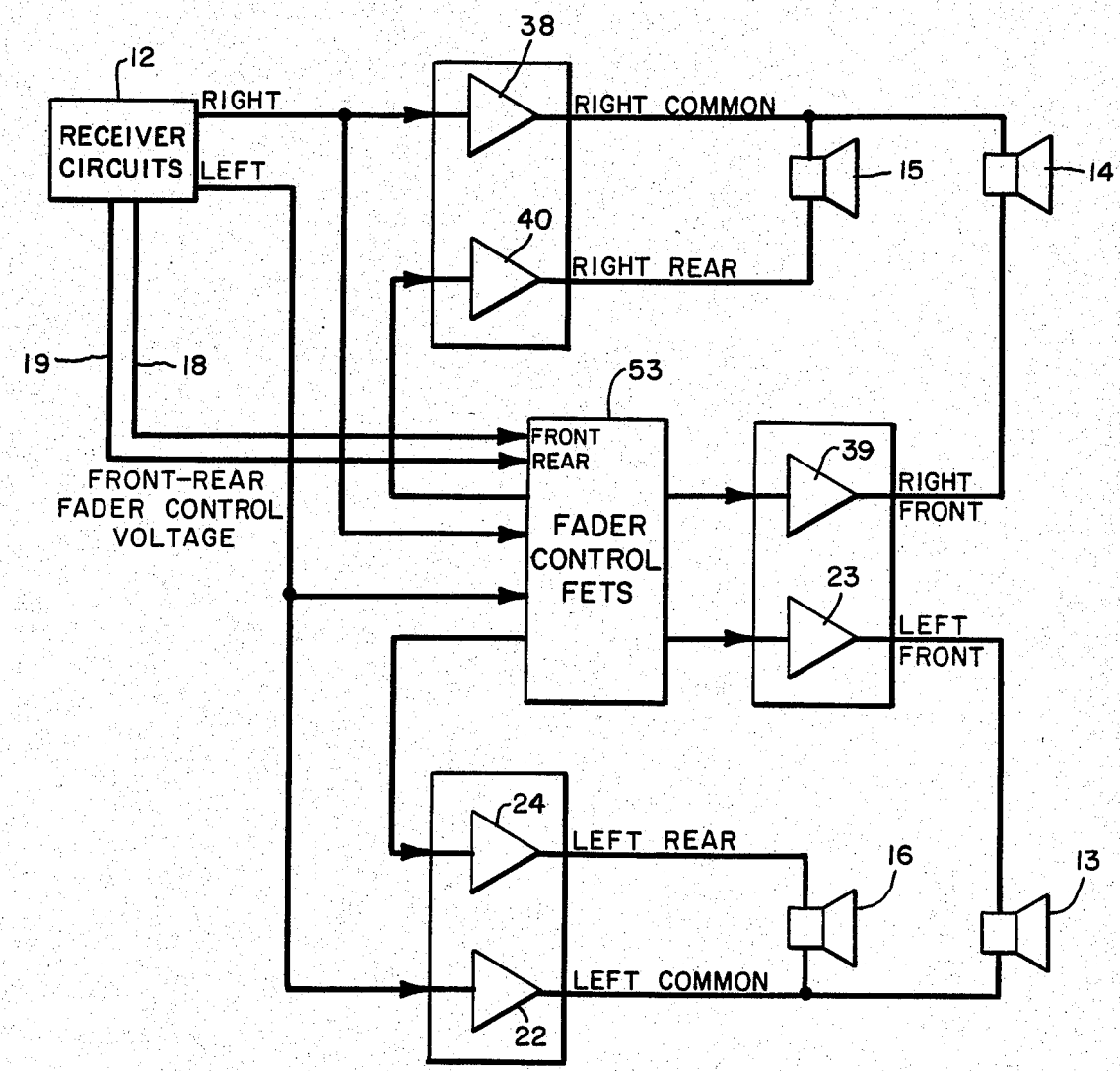
FIG. 3 is a simplified block diagram of a two channel stereophonic audio amplifier incorporating a fader control constructed in accordance with the present invention.

FIG. 3 illustrates one commercial embodiment of a two-channel stereophonic amplifier incorporating an electronic fader control constructed in accordance with the invention. Referring to the Figure, the amplifier is connected with the four loudspeakers 13–16 as shown. As further illustrated by the figure, the receiver circuit provides right and left channel audio information at its output, as well as fader control voltages on lines 18 and 19.

In the right channel, the output of first amplifier 38 is connected to one terminal each of the front-right 14 and rear-right 15 speakers while the outputs of the second and third amplifiers 39 and 40 are individually connected to the remaining terminals of speakers 14 and 15 respectively. Similarly, in the left channel the output of first amplifier 22 is connected commonly to speakers 13 and 16 while the second and third amplifiers 23 and 24 are individually connected to the remaining terminals of speakers 13 and 16 respectively.

As further illustrated in FIG. 3, the low-level right and left channel audio signals are applied directly to both the inputs of first common amplifiers 22 and 38 respectively, and the fader control circuit 53. Within the fader control circuit, suitable circuitry inverts the incoming low-level audio signals for application to the second and third amplifiers which, in conjunction with the first amplifier of each channel, drive the speakers of that channel. The fader control circuit 53 is responsive to front and rear fade control signals generated by the receiver circuitry 12 and adjusts the inputs signals applied to the right and left channel second and third amplifiers as necessary to effect the desired attenuation of the front and rear speakers.

Figure 4:
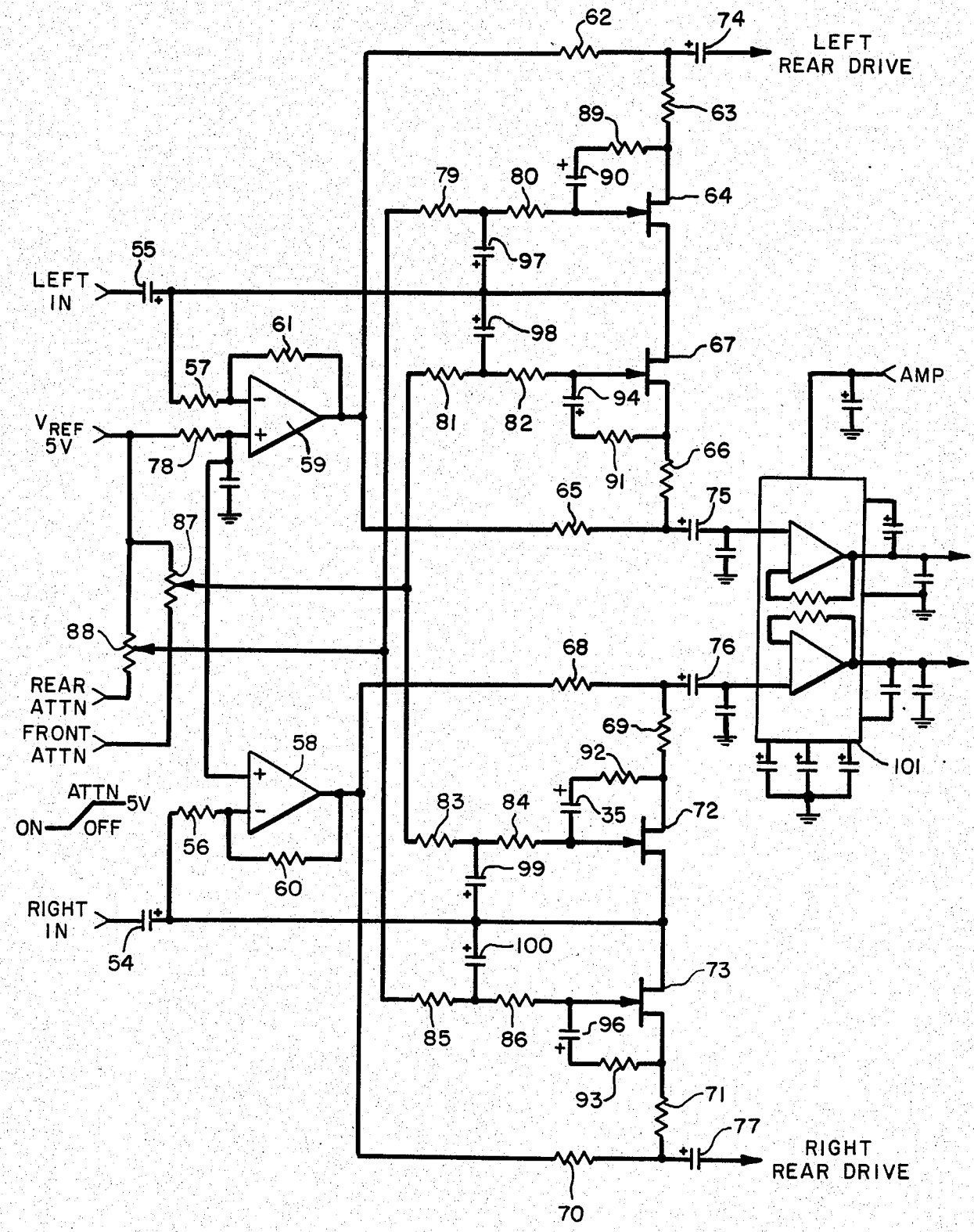
FIG. 4 is a detailed schematic diagram of the fader portion of the amplifier illustrated in FIG. 3.

FIG. 4 shows in detail the fader control circuitry included in the amplifier illustrated in FIG. 3. The circuit as illustrated serves to provide drive signals to one terminal of each of the four speakers 13–16, it being understood that the remaining terminals of the speakers are connected to the outputs of the right and left first common amplifiers 22 and 38 which do not form a part of the electronic fader control circuit.

Right and left channel audio signals are applied to the fader control circuit through coupling capacitors 54 and 55. The signals are then applied through resistors 56 and 57 to the inverting inputs of right and left channel inverting amplifiers 58 and 59. Resistors 60 and 61, each connected between the outputs and inverting inputs of the amplifiers, provide negative feedback to set the gain of the inverter and reduce distortion.

Referring to the left channel circuitry which is identical with that of the right channel, the output of inverting amplifier 59 is connected through resistors 62 and 63 to the drain of an FET 64. This output is also connected through a pair of resistors 65 and 66 to the drain of another FET 67. The source of each FET is connected to the left channel low-level audio input. Similarly, in the right channel, the inverted signal from applifier 58 is applied through resistors 68 and 69, and through resistors 70 and 71 to the drains of FETs 72 and 73 respectively, the sources of which are commonly connected to the non-inverted low level signal provided at the right channel input. Outputs for application to right and left channel second and third amplifiers 39, 23 and 40, 24 (FIG. 3) are derived through coupling capacitors 74–77, each having one terminal connected to the juncture of resistors 62–63, 65–67, 68–69 and 70–71 respectively.

Again referring to the left channel circuitry the inverted low level signals suppied through resistors 62 and 65 are combined with non-inverted signals applied through FETs and resistors 63,66 to produce outputs through capacitors 74 and 75 respectively. Accordingly, the magnitude of each output signal is determined by the magnitude of the individual inverted and non-inverted signals of which it formed. The magnitude of the inverted signals is dependent on the gain of the inverting amplifier 59 and resistors 62 and 65. The magnitude of the non-inverted signal added to the inverted signal to form the output signals depends primarily on the impedance of FETs 64 and 67 together with their series drain resistors 63 and 66. Since the source-drain resistance of each FET varies in accordance with the gate-to-source voltage, the magnitude of the non-inverted component may be continuously varied, thereby altering the magnitude and phase of the output signal. The right channel circuit operates in similar manner.

Referring further to FIG. 4, a positive polarity DC reference voltage is applied through a resistor 78 to the non-inverting inputs of inverting amplifiers 58 and 59. Accordingly, the output of each inverting amplifier is offset by a constant positive polarity voltage with the result that each of the FETs 64, 67, 72 and 73 is suitably biased for normal operation.

The impedance of each FET is controlled by means of a DC control voltage applied to their gate terminals through resistors pairs 79–80, 81–82, 83–84 and 85–86. A front attenuation control signal which, for example, may comprise a DC voltage continuously variable between the range of 0 and +5 volts, is applied to one end of a potentiometer 87 the opposite end of which is connected to the reference voltage. The wiper of potentiometer 87 is connected through resistors 81 and 82 to the gate of FET 67, and through resistors 83 and 84 to the gate of FET 72. A similar rear attenuation control voltage is applied to one end of a second potentiometer 88 the remaining terminal of which is also connected to the reference voltage. The wiper of this potentiometer is connected through resistors 79 and 80 to the gate of FET 64, and through resistors 85 and 86 to the gate of FET 73. Potentiometers 87 and 88 may be adjusted to provide a constant non-zero gate bias thereby assuring that each FET operates in its linear region.

FET 64 is provided with a negative feedback network in the form of the serial combination of resistor 89 and capacitor 90 connected between the drain and gate of the FET to significantly reduce distortion. Similarly, resistors 91–93 and capacitors 94–96 provide negative feedback for FET's 67, 72 and 73. Capacitors 97 and 98 in the left channel and capacitors 99 and 100 in the right audio channel couple the non-inverted signal to the gates of the respective FET's thereby precluding instantaneous variation in the gate to source voltage appearing by reason of instantaneous change in the non-inverted audio signal.

During operation, the application of a suitable DC control voltage to either the front attenuation or rear attenuation control inputs alters the gate bias of FET's 67 and 72 or FET's 64 and 73, which in turn increasingly or decreasingly couple the non-inverted signal to the audio output terminals. At low DC control signal inputs, the FET impedance is relatively high thereby reducing the effective non-inverted component of the output signals. Accordingly, the inverted component predominates and output from the speakers is maximized. Increasingly positive control voltages reduce the impedance of the FET's resulting in the introduction of a relatively greater non-inverted signal component with the effect that the magnitude of the inverted signal appearing at the output is initially reduced. At some point, the magnitudes of the inverted and non-inverted signals will exactly balance resulting in a zero signal output. Continued increase in positive control voltage will result in the introduction of a still larger non-inverted signal component with the result that the output signal is now of the same phase as the signal applied to the inputs of the common amplifiers 22 and 38 (FIG. 3). Audio speaker output will continue to diminish as the now in-phase fader control output signals approach the magnitude of the common amplifier input signals. Accordingly, the application of the control signals results in variable attenuation of the speaker outputs in response to the magnitude of each control signal input. Furthermore, since FET's 64 and 73 operate independently of FET's 67 and 72, the front and rear speakers may be independently attenuated through application of a control voltage to the appropriate control signal input line.

Ideally, amplifiers 22, 23, 24, 38, 39 and 40 (FIG. 3) will be of the same type and will have a high input impedance. Preferably, the gain of inverters 58 and 59 (FIG. 4) will be set so as to compensate for insertion loss through resistors 62, 65, 68 and 70, thereby assuring that any clipping which might occur occurs simultaneously in each of the amplifiers when FETs 64, 67, 72 and 73 are biased for maximum audio output. This increases the overall maximum power output available from the stereophonic amplifier before clipping occurs.

By way of example, for a typical attenuation range of 20 dB, resistors 62, 65, 68 and 70 should each be ten times the value of resistors 63, 66, 69 and 71. Different resistance ratios may be selected resulting in greater or lesser ranges of attenuation available with the electronic fader control circuit.

To assure equal attenuation of the right and left loudspeakers during attenuation of the front speaker pair, FET's 64 and 73 are preferably individual sections of a dual N-channel FET. Similarly, the use of a dual N-channel FET to perform the functions of FET's 67 and 72 results in accurate tracking of the right and left speakers during attenuation of the rear speaker pair.

To produce outputs suitable for driving loudspeakers, the outputs provided through capacitors 75 and 76 are applied to a dual amplifier 101 of known construction. It will be appreciated that similarly, capacitors 74 and 77 will also be connected with the inputs of a similar amplifying stage.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A two-channel audio amplifier for use with a multi-speaker stereophonic sound reproduction system of the type in which each audio channel includes first and second two-terminal loudspeakers, each channel of said audio amplifier comprising:

a first source of low-level audio signals, said first source providing low-level audio signals of one phase;

a second source of low-level audio signals, said second source providing low-level audio signals of phase opposite to the phase of said signals provided by said first source;

a first amplifier having its input connected with said first source and having its output commonly connected to one terminal of each of the first and second loudspeakers;

a second amplifier having its input connected with said second source and having its output connected with the remaining terminal of the first loudspeaker;

a third amplifier having its input connected with said second source and having its output connected with the remaining terminal of the second loudspeaker;

first variable impedance means connected between said first source and said input of said second amplifier for coupling said signals from said first source to said input of said second amplifier, the impedance of said first variable impedance means being continuously variable in response to application of a first control signal, the degree of said coupling thereby being controllable by said first control signal;

second variable impedance means connected between said first source and said input of said third amplifier, for coupling said signals from said first source to said input, the impedance of said second variable impedance means being continuously variable in response to application of a second control signal, the degree of said coupling thereby being controllable by said second control signal, whereby application of said first and second control signals regulates the magnitude of signals from said first source applied to said inputs of said second and third amplifiers thereby altering the audio output level of the first and second loudspeakers connected thereto.

2. An amplifier as defined in claim 1 wherein said second source comprises an inverting amplifier having its input connected with said first source and having its output connected with said inputs of said second and said third amplifiers.

3. An amplifier as defined in claim 2 wherein said first and second variable impedance means comprise first and second field-effect transistors (FETs).

4. An amplifier as defined in claim 3 wherein said first and second control signals each comprise continuously variable DC voltages applied to the gates of said first and second FETs.

5. An amplifier as defined in claim 4 wherein said first control signal is applied commonly to the gates of each said first FET in each channel of said amplifier, and said second control signal is applied commonly to said gate of each said second FET in each said channel of said amplifier.

6. An amplifier as defined in claim 5 wherein one of the principal electrodes of each of said first and second FETs is connected to said first source and the other principal electrodes of said first and second FETs are connected to the input of said second amplifier and the input of said third amplifier respectively.

7. A two-channel audio amplifier for use with multi-speaker stereophonic sound reproduction systems of the type in which each audio channel includes first and second two-terminal loudspeakers, each channel of said audio amplifier comprising:

a first source of low-level audio signals, said first source providing low-level audio signals of one phase;

a second source of low-level audio signals, said second source providing low-level audio signals of phase opposite to the phase of said signals provided by said first source;

a first amplifier having its input connected with said first source and having its output commonly connected to one terminal of each of the first and second loudspeakers;

a second amplifier having its input connected with said second source and having its output connected with the remaining terminal of the first loudspeaker;

a third amplifier having its input connected with said second source and having its output connected with the remaining terminal of the second loudspeaker;

first variable attenuator means connected between said first source and said input of said second amplifier, said first variable attenuator means coupling said signals from said first source to said input of said second amplifier, the attenuation of said first variable attenuator means being continuously variable in response to application of a first control signal, said first variable attenuator means thereby attenuating said signals coupled from said first source to said input of said second amplifier, the degree of said attenuation thereby being controllable by said first control signal;

second variable attenuator means connected between said first source and said input of said third amplifier, said second attenuator means coupling said signals from said first source to said input of said third amplifier, the attenuation of said second variable attenuator means being continuously variable in response to application of a second control signal, the degree of said attenuation thereby being controllable by said second control signal, whereby application of said first and second control signals controllably attenuates said signals from said first source applied to said inputs of said second and third amplifiers thereby altering the audio output level of the first and second loudspeakers connected thereto.

8. An amplifier as defined in claim 7 wherein said second source comprises an inverting amplifier having its input connected with said first source and having its output connected with said inputs of said second and said third amplifiers.

9. An amplifier as defined in claim 8 wherein said first and second variable attenuator means each comprise first and second field-effect transistors (FETs).

10. An amplifier as defined in claim 9 wherein said first and second control signals each comprise continuously variable DC voltages applied to the gates of said first and second FETs.

11. An amplifier as defined in claim 10 wherein said first control signal is applied commonly to the gates of each said first FET in each channel of said amplifier, and said second control signal is applied commonly to said gate of each said second FET in each said channel of said amplifier.

12. An amplifier as defined in claim 11 wherein one of the principal electrodes of each of said first and second FETs is connected through a resistor to said first source and the other principal electrodes of said first and second FETs are connected to ground whereby application of said control signals shunts said signals from said first source to ground.

* * * * *